United States Patent [19]
Ohkubo et al.

[11] 4,448,867
[45] May 15, 1984

[54] IMAGE FORMING METHOD AND DEVICE FOR SAME

[75] Inventors: Yukitoshi Ohkubo, Yokohama; Yoshiyuki Osada, Yokosuka; Masao Sugata, Kawasaki; Takashi Nakagiri, Tokyo, all of Japan

[73] Assignee: Canon Kabushiki Kaisha, Tokyo, Japan

[21] Appl. No.: 340,459

[22] Filed: Jan. 18, 1982

[30] Foreign Application Priority Data

Jan. 26, 1981 [JP] Japan .................. 56-9954

[51] Int. Cl.³ .................. G03G 13/00; G11C 13/00
[52] U.S. Cl. .................. 430/31; 430/42; 430/55; 346/153.1; 346/154; 346/155; 346/157; 355/3 R; 355/3 CH
[58] Field of Search ........... 430/31; 346/153.1, 154, 346/155; 355/3 R, 3 CH

[56] References Cited

U.S. PATENT DOCUMENTS 3,518,698  6/1970  Kazan et al. .................. 346/153.1
3,816,840  6/1974  Kotz .................. 346/74
4,005,436  1/1977  Kleinknecht .................. 346/155

FOREIGN PATENT DOCUMENTS 2006464  5/1979  United Kingdom .
2006465  5/1979  United Kingdom .

OTHER PUBLICATIONS

Electronics Letters, 3/15/79, vol. 15, No. 6.
"IEEE Transactions on Electron Devices", vol. ED-20, No. 11, Nov. 1973, pp. 995-1001.

Primary Examiner—John D. Welsh
Attorney, Agent, or Firm—Fitzpatrick, Cella, Harper & Scinto

[57] ABSTRACT

A method for forming images comprises applying voltage or electric charge to one or more electrodes selected from an electrode group comprising electrodes each of which has a transistor and attaching a toner to the selected electrodes. A device for forming images comprises an electrode group and a toner supplying device, each of electrodes of the electrode group being provided with a transistor.

33 Claims, 15 Drawing Figures

IMAGE FORMING METHOD AND DEVICE FOR SAME

BACKGROUND OF THE INVENTION

1. Field of the Invention

This invention relates to a new image forming method and a device for forming images, and particularly, to an image forming method having image display function, image recording function and image display and recording function, and a device therefor. This invention more particularly relates to an image forming method in which a plurality of electrodes are controlled by transistors connected to the electrodes and thereby a toner is selectively attached to the electrodes, and a device therefor.

2. Description of the Prior Art

There are known a wide variety of image forming devices. Various systems have been used for cameras, copiers and printing machines.

In the recent technology of electronics, there are strongly demanded the image forming devices which are easily controlled by electronics (condition-1), require only low voltage and low power (condition-2) and are small in size and light in weight (condition-3).

In addition, innovation of each particular type of image forming devices is requested.

For example, one type of electrophotographic cameras, dream camera, seeks to satisfy the above-mentioned three conditions and use a non-silver salt photosensitive member. This new electrophotographic camera is demanded since silver resources are depleted year by year.

On the other hand, a device for forming images instantly is known as an "instant camera". There are also known simple instant image forming methods utilizing electronic control.

Further, in the case of copying machines, there have been shown recently remarkable advances with respect to small size, light weight and low power consumption, but there are not yet available any truly portable copying machines.

These image forming devices are required to have a function of optionally adding information as well as a function of reproducing originals with high fidelity. In other words, there are desired display of output from language treating devices such as those known as "word processors" and terminal devices capable of converting output of computers or output of telephone and communication circuits to letters, drawings or images.

These devices overlap the devices known as facsimiles or printers. As domestic image forming terminals in future, it is desired that a single output terminal for various imaging signal sources can effect both computer treatment and the conversion without having separate output mechanisms for computer treatment and for communication circuits.

In this sense, safety and easy maintenance are desired. From this point of view, a method employed in conventional copiers for forming images comprising producing latent images corresponding to light images of an original on a photosensitive member of a photoconductor, developing with a toner and transferring the developed images is not suitable for the image formation of external electric signals. In addition, since the conventional copiers require a high voltage at the image transferring step using an electric field and use a photosensitive layer drum, the copiers can not be small in size and portable.

On the other hand, the step of forming latent images of external electric signals has been recently achieved by a laser beam printer, and this step comprises converting electric signals to light signals and conducting the image writing on a photosensitive layer by the light signals. A device having such a mechanism can be used as an image forming device capable of producing rapidly images of high quality, but the device is not easily used as the above-mentioned small type portable image terminal, since a light writing device must be added to a conventional copying machine.

Conventional image forming devices are limited to a mechanism whereby a hard copy is produced, that is, images are formed on paper and the like. However, image forming terminals to be demanded in the future will not always be required to produce finally a hard copy. That is, output visualized information often becomes unnecessary after it has been read. Further, it is not always desired that visualized information to be stored are stored as a hard copy, since wood pulp resources will be depleted when paper is used for the hard copy and besides the resulting hard copy requires increased space for storing.

In view of the foregoing, in case an image forming terminal is required only to show a display function in future, it is desired that the display by the image forming terminal can be erased after the display has been read. Such operation can be effected by various known display devices. However, whatever type the display device is, for example, an active type or a passive type, the display is an optical image, and therefore, if it is desired to have it as a hard copy, a separately provided image forming device is operated or the displayed optical image is projected to an image forming device.

The above-mentioned word processing device can advantageously edit and erase the letter information while producing the letter information, but a lot of memory elements are disadvantageously required if the processing device should temporarily store long sentences for display and writing. In order to decrease the number of memory elements, it is desired that the writing information itself function as the display information and when the whole sentences are completed, the display information itself can be transferred as a hard copy.

Devices satisfying the above conditions are not yet commercially available.

Some devices can effect writing and rewriting for optional images and after that, a hard copy thereof can be obtained. It is desired that such operations can be effected without memory elements corresponding to the whole picture elements, but any device effecting such operations is not commercially available.

SUMMARY OF THE INVENTION

An object of the present invention is to provide an image forming method and device therefor having novel functions which are not obtained by conventional image forming methods, and also to provide a display device where both writing and erasing are possible.

Another object of the present invention is to provide an electronic recording method and a device therefor.

A further object of the present invention is to provide an electronic display method and a device thereof.

Still another object of the present invention is to provide an electronic display and recording method where both display and recording can be effected in the same process and a device therefor.

A still further object of the present invention is to provide a novel recording method usable for an electronic instant camera of non-silver salt type, and a device therefor.

Still another object of the present invention is to provide a novel display method, a recording method or a display and recording method giving output terminals for displaying and recording optionally a light information, communication information, or electronic treating information, and devices therefor.

A still further object of the present invention is to provide a method by which the above devices can be operated at low voltage at low power consumption and can be of low weight.

According to the present invention, there is provided a method for forming images which comprises applying voltage or electric charge to one or more electrodes selected from an electrode group comprising electrodes each of which has a transistor and attaching a toner to the selected electrodes.

According to another aspect of the present invention, there is provided a device for forming images which comprises an electrode group and a toner supplying device, each of the electrodes of the electrode group being provided with a transistor.

DESCRIPTION OF THE PREFERRED EMBODIMENTS

FIGS. 1-14 show embodiments of the present invention.

Figure 1:
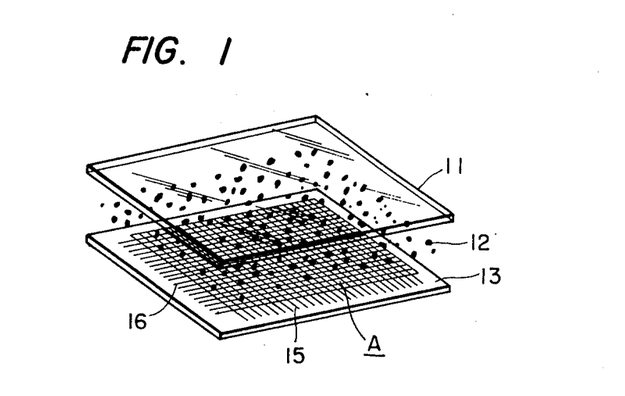
FIG. 1 shows an oblique view of a fundamental structure of the present invention.

FIG. 1 shows the fundamental structure of the present invention. 11 denotes a substrate having a counter electrode, 12 denotes a toner, and 13 denotes a bottom substrate having an upper surface facing the substrate 11 and provided with a group A of dot-like electrodes (corresponding to 14, 14', 14", 14''' in FIG. 2), and each dot-like electrode has a transistor. Where the transistor is a field-effect transistor (hereinafter referred to as "FET"), there are dot-like electrodes connected to the semiconductor and source electrodes 15 and gate electrodes 16. The source electrodes 15 and gate electrodes 16 are connected lead electrodes, respectively. The toner is present in the space defined between the upper substrate 11 and the bottom substrate 13.

Figure 2:
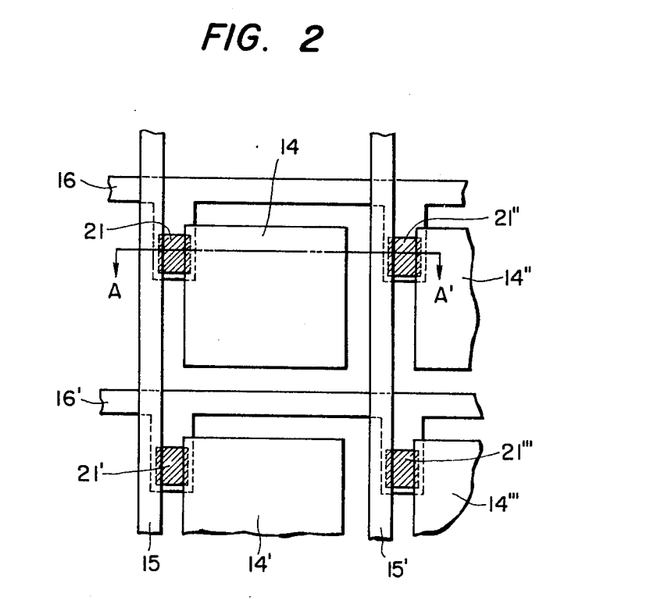
FIG. 2 is a plan view of a substrate provided with plural electrodes to which transistors are connected, the substrate being used for a fundamental structure according to the present invention.

Referring to FIG. 2, an enlarged plan view of a part of the bottom substrate, one end of each dot-like electrodes 14, 14', 14", 14''' is connected to one end of the corresponding semiconductor 21, 21', 21", 21'''. The other ends of the semiconductors are connected to source electrodes 15 and 15', and the connection is common to each row. Gate electrodes 16 and 16' are led to a portion below the semiconductor by way of an insulating layer, cross source electrodes 15 and 15' by way of an insulating layer, and each gate electrode is common to a group of semiconductors arranged at one line.

Figure 3:
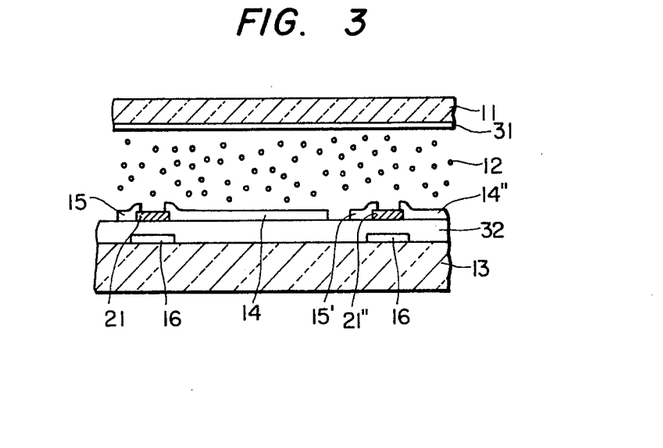
FIG. 3 is a cross-section of FIG. 2 taken along the A—A' line.

FIG. 3 is a cross sectional view of FIG. 2 taken along the line A—A'. An upper substrate 11 is provided with an electrode 31 at the lower surface. When upper substrate 11 itself is conductive, electrode 31 is unnecessary. On a bottom substrate 13 is mounted FET of MOS (metal-oxide-semiconductor) type. A gate electrode 16 is mounted on bottom substrate 13, and an insulating layer 32 is disposed thereon.

On insulating layer 32 are mounted semiconductors 21 and 21", and source electrodes 15 and 15' are connected to one end of semiconductor 21 and of semiconductor 21", respectively, and dot-like electrodes 14 and 14" are connected to the other end of semiconductor 21 and the other end of semiconductor 21", respectively.

In the space between substrates 11 and 13, there are a lot of toner particles 12 which are introduced into the space upon forming images.

Figure 4:
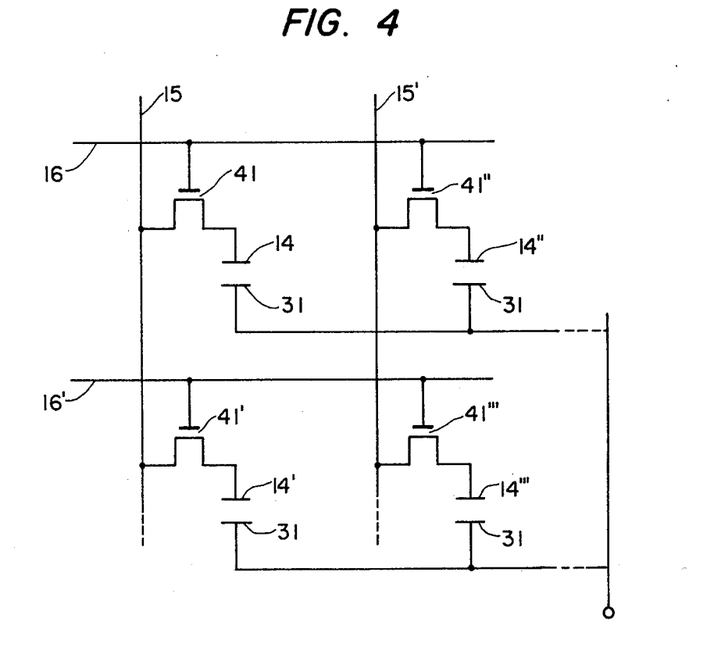
FIG. 4 shows an equivalent circuit used in the present invention.

FIG. 4 shows an equivalent circuit of the above-mentioned device. Like reference numbers show like portions in FIGS. 1-3 and FIG. 4. 44, 41', 41", and 41''' in FIG. 4 are FET formed at the portions of semiconductors 21, 21', 21" and 21''' respectively. 31 is a common electrode to dot-like electrodes 14, 14', 14" and 14'''.

A method for driving the equivalent circuit is as shown below. For example, a scanning signal is applied to gate electrodes 16, 16'. When a scanning signal is applied to FET, the FET becomes conductive. And then, when an image signal is applied to source electrodes 15 and 15' which cross at a right angle with the gate electrodes, this voltage or electric charge is applied to dot-like electrodes 14 and 14". Subsequently this scanning signal is transferred to the adjacent gate electrode, and when TFT (thin film transistor) at each line become on-state, voltage or electric charge is subsequently applied to the dot-electrode group at the line and this application passes through the whole gate lines, and thus, image signals are applied to all the picture elements. Application of voltage to the electrodes 15, 15' is carried out by a line-at-a-time scanning (not a serial scanning in which a signal is sent subsequent to scanning each picture element) so as to obtain effective voltage or electric charge for the dot-electrodes. That is, at gate-on signals are applied to all the dot-like electrodes at a line at the same time. The image voltage or electric charge thus applied selectively attracts electrically toner 12 present between the substrates facing each other. Toner particles not electrically attracted are then removed and thereby, toner images are formed on the selected dot-like electrodes on substrate 13. The present invention is based on the formation of toner images on the dot-like electrodes of TFT by means of image electric signals. When color toners are used, color images can be directly read, and a hard copy can be obtained by transferring the resulting color images to a paper, film or the like.

Figure 5:
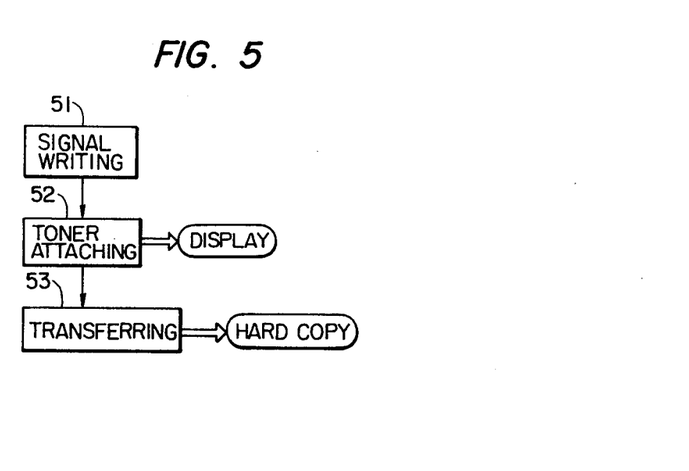
FIG. 5 is a flow chart showing main steps of the process according to the present invention.

Main steps used in the above-mentioned fundamental constitution of the present invention are illustrated in FIG. 5. Voltage or electric charge is applied so as to form images on the dot-like electrode group on the substrate 13. This step is shown as "signal writing" 51 in FIG. 5. Then, toner particles 12 selectively attach to the dot-like electrodes 14, ect. depending upon the voltage or electric charge supplied. This step is shown as "toner attaching" 52. When the device is so constructed that the image signals can be seen by the selectively attached toner images, the device can be used as a display device.

Then, the selectively attached toner portions(attaching by electrostatic attraction) or non-attached toner portions (but a toner is present there though the toner is not attached thereto by electrostatic attraction) are transferred to a paper or film(image receiving member) as shown as "transferring" 53 in FIG. 5, and the resulting transferred images can be obtained as a hard copy. The device to produce a hard copy is a recording device.

Therefore, according to the present invention, there can be provided a display method and apparatus therefor as in step 52, a recording method and apparatus therefor as in 53, and a display and recording method and apparatus therefor as in steps 52 and 53.

The steps explained above may be conducted contemporaneously. In particular, in the case of only recording without any display mechanism, the transferring step may be carried out contemporaneously with the toner attaching step.

The steps illustrated in FIG. 5 are only the main steps of the present invention, and therefore, actual devices should be additionally provided with a toner supplying step, a step of feeding recording papers, a step of fixing the transferred toner, and the like.

If necessary, a cleaning step is effected for producing the second copy.

According to the present invention, various developing methods may be used depending upon voltage or electric field applied to the picture elements, i.e. dot-like electrodes 14, 14', 14", 14''' etc. In FIGS. 1-4 showing the fundamental constitution of the present invention, the explanation is made as to a step of attaching the charged toner 12 to the dot-like electrodes 14, etc. by electric attraction, the toner 12 being charged by the electric field between the counter electrode 31 and the dot-like electrodes 14, 14', 14", 14'''. The electric field between the counter electrode 31 and the dot-like electrodes 14, 14', 14", 14''' may be that formed between the electrodes facing each other by the voltage applied by the signals from source electrodes 15, 15' or that retained between the electrodes facing each other by electric charge retained by electrostatic capacity between the electrodes facing each other produced by a once applied voltage.

Even if a selected dot-like electrode does not have a counter electrode, toner particles can attach thereto as long as an accumulated charge is retained on the dot-like electrode. In addition, even when toner particles are not charged, they are attracted and attached to a dot-like electrode by electrostatic induction. Further, toner particles may be optionally introduced by various methods such as distributing toner particles through a wire netting, a cascade method comprising moving toner particles held by an appropriate carrier on the surface, a method comprising introducing a magnetic toner by a magnetic brush, a method comprising introducing toner particles attached to a fur, a method comprising introducing a toner by means of a liquid, and the like. And various devices using such methods may be optionally used.

In the following, the method where an electric field is employed will be explained.

In FIG. 3, there is not shown paper or film as an image receiving member upon transferring, but FIG. 3 is a fundamental diagram for explaining steps up to a selective attaching of a toner to the substrate 13 depending upon image signals. The transferring step may be conducted by various methods.

Figure 6:
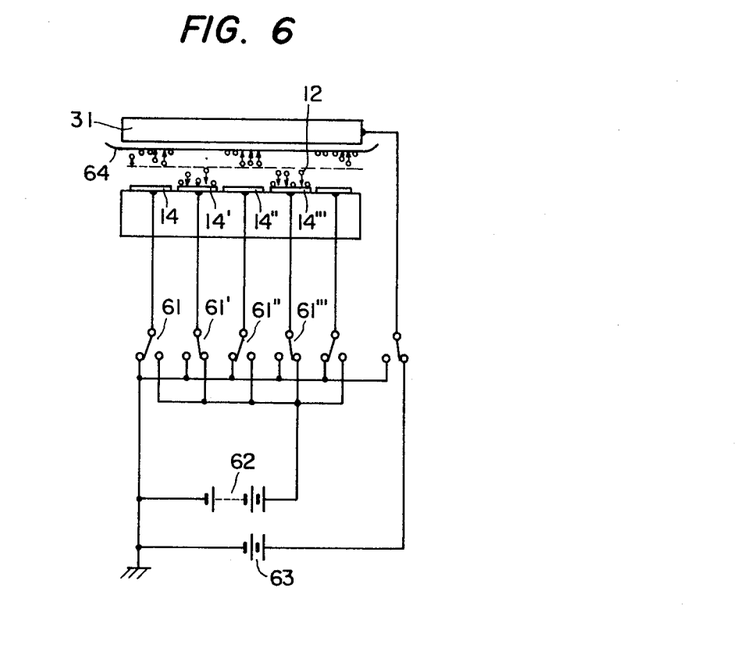
FIG. 6 shows diagrammatically a step for attaching a toner according to the present invention.

FIG. 6 shows an embodiment wherein a step of selective attaching of a toner 12 to dot-like electrodes 14, 14', 14", 14''' and a step of transferring the toner 12 thus attached to a paper or film proceed simultaneously. Each of dot-electrodes 14, 14', 14", 14''', etc. has a transistor in the same manner as in FIGS. 1-4.

However, for the purpose of simplifying the explanation, the transistors are replaced by a group of switches 61, 61', 61", 61''', etc. The selected dot-like electrodes 14' and 14''' are connected to a power source 62 and the non-selected dot-like electrodes 14 and 14" are grounded. An image receiving member 64 such as paper, film and the like is inserted between the electrodes facing each other and disposed at the counter electrode 31 side, writing of electrosignals having been made between the electrodes. The counter electrode 31 is then connected to power source 63. When negatively charged toner particles 12 are placed at a middle zone between the electrodes, some toner particles attach to electrodes 14' and 14''' to which a voltage is selectively applied and the other toner particles 12 are attracted toward counter electrode 31 and therefore, the toner particles 12 adhere to paper or film 64 to produce recorded images. The recorded images correspond to a reversed pattern of the images on the dot-like electrodes, and therefore, when the images to be written on the dot-like electrodes are negative pattern, the resulting recorded images are positive pattern. According to the present invention, the switch group is constructed by TFT, and the conductive state and the non-conductive state of the TFT are scanned in a time division manner with respect to a line electrode group and a row electrode group in a matrix form. Since the scanning is effected in a manner of time division, the voltage applied to the dot-like electrodes is not a continuous voltage as shown in 62, but a pulse voltage. However, this difference is not an essential difference in the voltage applied, but a difference in effective voltage only. Further, when the voltage applied to the dot-like electrodes is controlled, it is possible to change the amount of a toner attaching to the dot-like electrodes. This means that a gradation display is easy according to the present invention.

Figure 7:
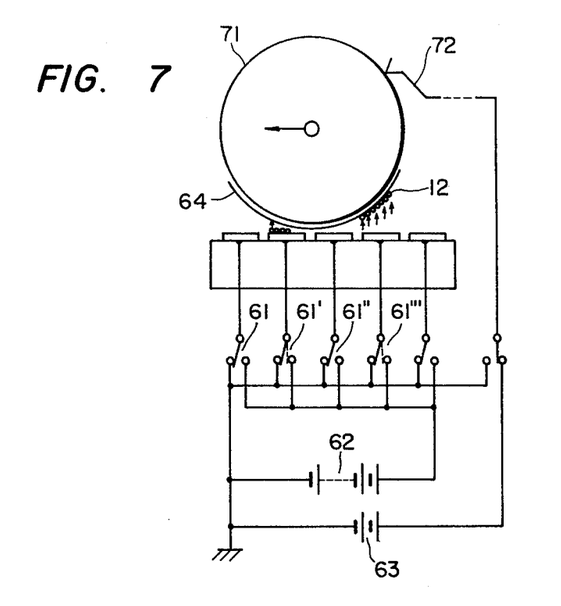
FIG. 7 shows diagrammatically a step of transferring.

FIG. 7 is another embodiment of transferring. An image receiving member 64, e.g. paper, is attached to a drum 71 whose periphery is conductive, and the voltage of the drum 71 is made higher than that of the group of the dot-like electrodes to which a toner 12 is selectively attached, and the toner attached is transferred to paper 64. In this transferring step, the positive pattern on the dot-like electrodes is transferred to the paper as a positive pattern. It should be noted that in both this transferring and the previous transferring the pattern on the selected dot-like electrodes is a mirror image as to the original, i.e. the front and the back are reversed. On the other hand, a positively charged toner may be used, and in this case, if a voltage of the same polarity as that in FIG. 6 and FIG. 7 is applied, there is obtained a negative/positive reversed image in each figure. If each polarity is reversed, the result is the same as that as mentioned previously.

In the following, the above-mentioned techniques are used as displaying devices.

Figure 8:
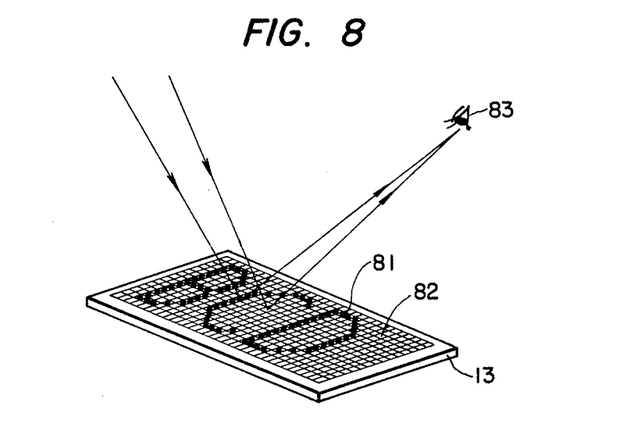
FIG. 8 is an oblique view when the image display is made in a reflection form.

Referring to FIG. 8, a toner is selectively attached to dot-like electrodes each of which is provided with FET, and reference numerals 81 and 82 indicate the toner attached portion and the toner non-attached portion, respectively, and there appears "BCD" on a substrate 13. Reading can be made possible based on the difference between the optical characteristics of the toner attached portioned and those of the non-attached portion, and there can be obtained a desired contrast by selecting the difference appropriately. One of the simplest means is that the toner is made of particles containing a pigment or dye showing a black absorption and the electrode is made of a scattering surface of a metal or a reflective surface of a metal. Such display gives a very high contrast ratio and a widespread angles for an observer 83. When this reading manner is employed in the procedure of FIG. 7 in which 71 and 72 denote a conductive drum and an electric connection terminal, respectively, and the toner is transferred to a transparent film, there is obtained the same images as those of the display. It should be noted that in this case the images are the same as those of the display where observed from the back side of the receiving film. However, when the toner images are transferred to an opaque paper, there are obtained transferred images which are mirror images as to the original, i.e. the front side and the back side of the original images are reversed, and therefore, the images thus transferred can not be used as an ordinary hard copy.

Figure 9:
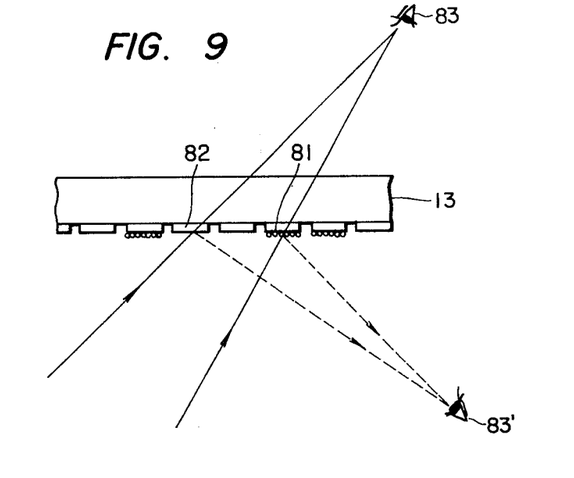
FIG. 9 is a cross-sectional view when the image display is made in a transmission form.

In FIG. 9, the pattern of toner selectively attached portions 81 is a mirror image for an observer 83', but is a positive image of the original for an observer 83 as a display and further, can be transferred to a receiving paper to produce a hard copy which is the same pattern as the original.

Figure 10:
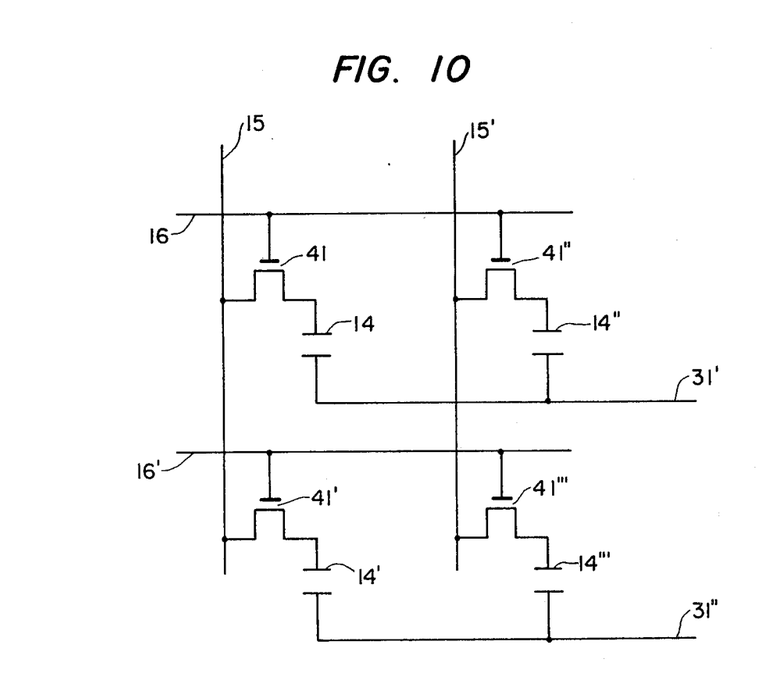
FIG. 10 is another equivalent circuit according to the present invention.

Erasing also can be carried out by utilizing the transferring step as is understood from the following explanation of steps. FIG. 10 shows an equivalent circuit wherein counter electrodes 31' and 31" facing the same gate line are electrically independent for effecting partial erasing. Erasing is carried out by first applying a voltage to a gate electrode 16 to make transistors 41, 41" conductive. When a toner is attached to dot-like electrodes 14, 14" and it is desired to erase the toner, voltage of source electrodes 15 and 15' is made ground potential or negative, and voltage of the counter electrode 31' is made positive. And then, when a negatively charged toner is applied, the toner on the dot-like electrodes 14, 14" is attached to the counter electrode 31'. As a result, the toner on dot-like electrodes 14, 14" disappears and therefore, the display is erased.

When erasing only one of them is desired, a positive voltage is applied to source electrode 15 or 15' while the other is grounded or of negative voltage. When electric charge is retained on the electrodes, a voltage capable of repulsing the charged toner is applied to the electrodes to be erased, or a voltage is applied to the counter electrode so as to increase the attraction of the counter electrode. In this way, erasing can be effected in the same manner as an electronic scanning of writing. It is also possible that an electric charge or voltage is supplied only to dot-like electrodes (picture elements) so as to selectively interrupt the attachment of toner without dividing the counter electrode.

Before erasing wholly or writing new images, it is effective to wipe the surface by a mechanical means, blowing off the toner by a blower, or removing the toner with a liquid, in addition to such electronic erasing as mentioned above.

Each function of the present invention will be understood by the above explanation.

In the following, the construction of the electrode group provided with transistors will be explained in detail.

The dot-like electrode group provided with transistors as illustrated in FIG. 2 can be most easily produced by a semiconductor circuit utilizing a silicon wafer substrate, that is, one electrode of a transistor of an MOS (metal oxide semiconductor) type is used as a dot and many of the dots are arranged in a form of dot-matrix and used as electrodes to which a toner attaches. A similar construction may be obtained by an SOS (silicon-on-sapphire) semiconductor circuit using a sapphire substrate.

One of the very effective embodiments of the present invention uses TFT. When TFT is utilized, the embodiment is free from various disadvantages attributable to a crystalline silicon wafer substrate as used above such as incapability of transparent display which can be observed from the back side as shown in FIG. 9, difficulty in producing a large area crystalline silicon wafer, expensive substrate materials, formation of crystal defects and the like. An SOS semiconductor circuit has a sapphire substrate which is expensive and difficult to produce with a large area.

In the present invention, the above-mentioned ones may be used, but when TFT is used, a better result is obtained. In the case of TFT, a transparent substrate such as glass, transparent quartz, transparent ceramics and the like can be easily used, and the semiconductor circuit can be produced by a thin film forming technology. Such technology has been researched with respect to CdS, Te and the like thin film, but a practical technology can not be yet completed.

According to the present invention, such materials are not excluded, but a silicon semiconductor in a thin film form is very useful. The silicon thin film may be produced as an amorphous silicon or polysilicon on the above-mentioned amorphous substrate. Such silicon thin film is usually formed in a vacuum vessel so that a large area substrate can be easily produced by employing a large scale film forming device. For producing a transistor, electrodes and insulating layer are necessary, and these members also can be produced by such thin film forming technology.

For example, in the case of an amorphous silicon transistor, the silicon layer can be formed by a glow discharge of $SiH_4$ gas. If necessary, $H_2$ gas and an impurity gas for doping such as boron, phosphorus and the like may be incorporated.

The insulating layer may be produced by a CVD (chemical vapor deposition) method comprising thermal decomposition of silicon compounds, thermal oxidation of silicon, sputtering of $SiO_2$, or formation of silicon nitride film by using a mixture of a silane gas and nitrogen or ammonia.

The electrode may be produced as a metal film by a resistive bushing vapor deposition, electron beam vapor deposition, sputtering or the like.

The transparent electrode may be produced as follows. For example, tin oxide and indium oxide are produced by thermal decomposition of organic tin compounds (spray method) and oxidation of a vapor-deposited metallic indium, respectively.

The processing for fabricating the member thus produced into a transistor may be carried out by repeating several times a cycle of mask formation and etching, for example, application of lithography and electron beam exposure which are conventionally used in silicon semiconductor technology. Further, a plasma etching may be used.

According to the present invention, in addition to the above-mentioned thin film silicon semiconductor, there may be used a thin film CdS semiconductor, thin film Cd.Se semiconductor or thin film Te semiconductor.

The toner may be the same as that used for electrophotographic copying machines.

As a material for the toner, there may be used usually thermoplastic resins. A coloring agent and a resin are uniformly mixed and finely divided to produce a toner. As the coloring agent, various pigments and dyes may be used. Electric resistance, triboelectric property, and color of the toner are adjusted to desired value for actual use. Particle size of the toner is usually from about 10 microns to 1 micron. According to the present invention, the resolution is limited by the area of the dot-like electrode as a picture element and therefore, it is not necessary to use so small a particle size of the toner.

According to the present invention, when a development is effected by using the TFT construction with a distance between facing electrodes of 50–500 microns at a signal voltage of 3–50 V, a sufficient writing and development can be effected. An electric current lower than 1 μA can supply a sufficient voltage or electric charge to a dot-like electrode, a picture element, of 100 microns×100 microns in size. Therefore, according to the present invention, writing and development for a device having 100,000 bits of picture element can be effected with a driving voltage of 15 V and power consumption of less than several tens mW.

Power consumption is usually large in a step of paper feeding and a driving mechanism for image transferring. Even if such power consumption is added, the total power consumption is very low and the necessary device is small in size and low in power since a high voltage mechanism required for corona discharge in a Carlson process is not necessary. Sufficiently small picture elements can be easily produced by utilizing a presently known integrated circuit technique, and it is possible to obtain a resolution of 2 lines/mm–20 lines/mm.

According to the present invention, fixation after transferring may be effected by fusing a resin toner or dissolving a toner partially followed by vaporizing the solvent.

As other embodiments of the present invention, there may be combinations of various active elements and passive elements in the fundamental circuit structure.

Figure 11A:
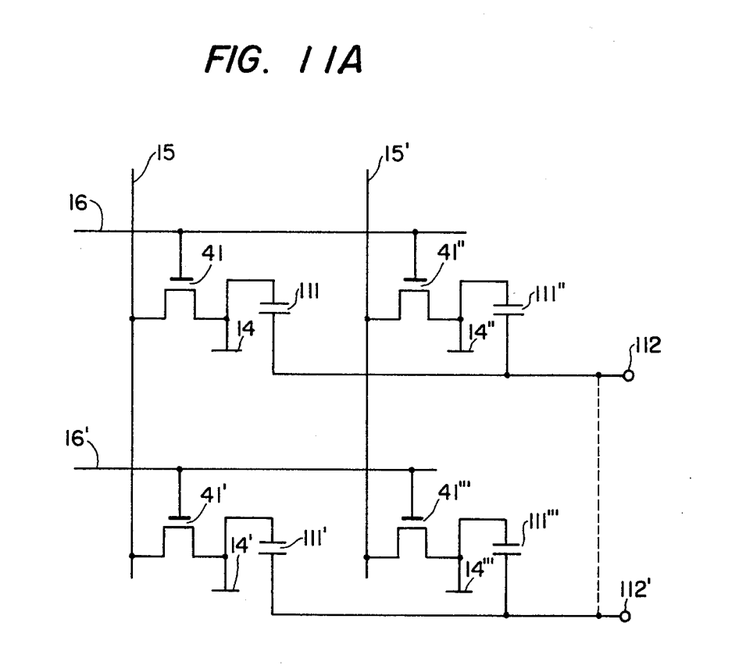
FIG. 11A is a further equivalent circuit according to the present invention.

Referring to FIG. 11A, an equivalent circuit of a transistor substrate which may be used in the present invention is shown. Dot-like electrodes as picture elements, 14, 14', 14" and 14'" are connected to capacitors 111, 111', 111" and 111'", respectively. These capacitors may be produced by a thin film forming technique as the transistors used in the present invention.

Figure 11B:
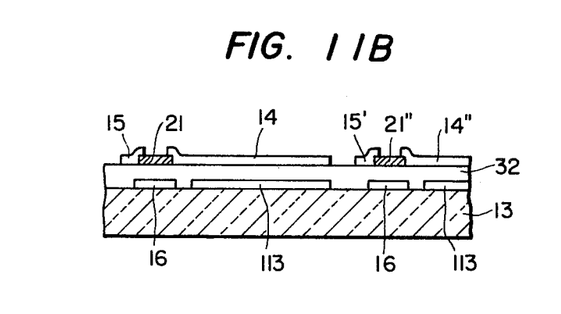
FIG. 11B is a cross-sectional view of the substrate according to the present invention.

FIG. 11B shows a structure corresponding to the transistor substrate of FIG. 3 except that capacitors are added and the counter electrode 31 and toner 12 are omitted. Like reference numerals show like portions.

Capacitors 111, 111', 111", 111'" may be produced as shown below. A member 113 is produced by simply separating the member 113 from a gate electrode 16 by etching to form a thin separating line, the gate electrode 16 being on the same plane as the member 113. Since an insulating layer 32 is present between dot-like electrodes 14, 14" and members 113, the resulting structure can form capacitors. The capacitor counter electrodes are commonly connected to outside 112, 112' through lead portions as shown in FIG. 11A. The connecting terminal of the capacitor counter electrodes may be separately provided for each gate as shown in this embodiment, but also may be a common conductive thin film provided under all dot-like electrodes to be picture elements with an intervening insulating layer. It is also possible to connect to gate lines for addressing 16, 16' themselves. Further, the counter electrodes of capacitors 111, 111" may be connected to the adjacent gate line 16'. Such capacitor is effective to retain signals sent through signal lines 15, 15' in a form of electric charge for a certain period of time by the capacitors.

This will be understood by comparing with the construction shown in FIG. 3 with respect to a "writing" process. In FIG. 3 the amount of accumulated electric charge is determined by the distance between the facing electrodes while in FIG. 11 a definite electric charge can be accumulated without any counter electrode.

Capacitors of high capacity are easily produced in the case of FIG. 11 as compared with FIG. 3. Therefore, the device in FIG. 11 can be practically driven by a low voltage.

Figure 12:
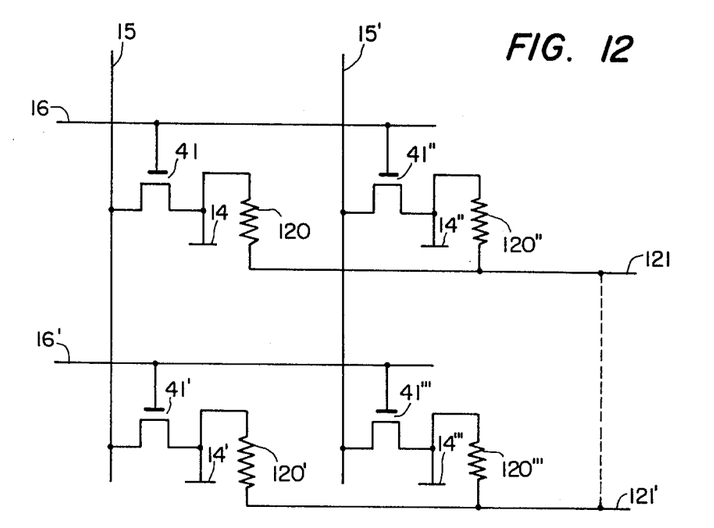
FIG. 12 is a still further equivalent circuit.

FIG. 12 shows a further embodiment where resistors are provided. When the value R of the resistances 120, 120', 120", 120'" satisfies the relation, $$R_{on} < < R < < R_{off}$$

where $R_{on}$ is on-resistance of a transistor and $R_{off}$ is off-resistance of a transistor, signals having a large S/N ratio can be applied to each electrode while in FIG. 4 the dot-like electrodes 14, 14', 14", 14'" are liable to be influenced by stray capacity. The resistor terminals 121, 121' may be connected to address gates lines or to adjacent gate as alternative embodiments in the case of the above-mentioned capacitors. It is also possible to obtain such resistance components by leakage to the counter electrode as shown in FIG. 3.

In the above explanations, charged dry particles in air selectively attach to the dot-like electrodes. Alternatively a liquid developing system may be used, that is, the toner particles 12 in FIG. 3 may be those dispersed in a liquid poured into the space between the two electrodes. This liquid is usually an insulating material such as a difficulty combustible solvent of petroleum series and the like. The resistors shown in FIG. 2 may have a resistivity similar to that of the difficultly combustible solvent of petroleum series as mentioned above.

Still another modified embodiment is that each of FET 41, 41', 41", 41''' is replaced by a pair of FET of n-channel semiconductor and FET of p-channel semiconductor. Thus, it is possible to selectively apply positive or negative voltage to dot-like electrodes 14, 14', 14", 14'''. In this way, it is possible to further broaden the range of voltage or electric charge to be applied to the toner. A simplest example is that a voltage or electric charge repulsing the toner is applied to an electrode to which the toner is not to attach while a voltage or electric charge attracting the toner is applied to an electrode to which the toner is to attach. Thus, when positive toner and negative toner have different colors from each other, it is possible to develop two colors in one step.

As mentioned above, active and passive elements to be connected to dot-like electrodes may be almost similar to those used for ordinary integrated circuits, and according to the present invention, combinations of those connecting circuit elements are not particularly limited.

In the above embodiments of the present invention, the dot-like electrodes are arranged in matrix form, but according to the present invention many electrodes may be arranged on one straight line. Such embodiment is particularly effective as a recording head having a very high resolution, that is, the electrode portions with transistor portions to be picture elements are arranged on a straight line at a high density.

A still further embodiment is that electrodes to be picture elements are circularly arranged. At the center of the circle is formed a transistor portion, and each picture element electrode portion is arranged on a circle. Such arrangement makes fine and precise processing of transistors easy. Polar coordinate recording such as circular graphs can be obtained without complicated computer treatment and mechanical treatment.

For exclusive use of display and recording of fixed form letters, various fixed form marks or numerical display of 7-segment type may be used, and for the use of letters and numerals, picture elements of segment type are preferable.

When the image forming device is constructed by dot matrix electrodes, it is not always necessary that the shape of the dot is a four-sided polygon as indicated by 14 in FIG. 2. When the arrangement of the dots is not so dense, circular dot-like electrodes often give a good apparent continuity, in particular, continuity of a curved line. Therefore, the shape of a dot-like electrode may be a square, rectangle, triangle, circle, ellipse, diamond, or other polygon.

Various modifications can be made depending upon the structure of semiconductors for fabricating a thin film as shown below.

Figure 13:
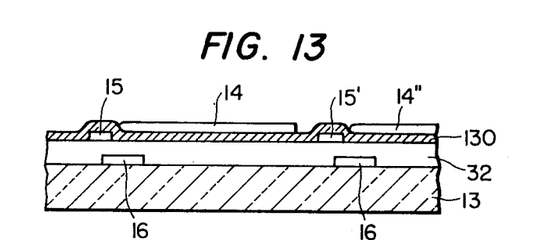
FIG. 13 is a cross-sectional view of a further substrate.

In FIG. 13, source electrodes 15, 15' applying signals are arranged under a semiconductor 130. This construction has an advantage that a toner does not attach to source electrodes 15, 15' and unnecessary image formation does not occur at portions other than the dot-like electrodes (picture elements) due to a shielding effect by the semiconductor portion when a semiconductor is formed all over the surface without pattern.

The bonding portion between a semiconductor and an electrode member is generally apt to form a junction, and therefore, where a source and a drain are symmetrically disposed as to a semiconductor as shown in FIG. 3, the arrangement tends to be such that diodes are disposed in opposite directions. On the contrary, in FIG. 13, diodes are arranged in one direction, and therefore, the substrate of the present invention can be obtained without paying any particular attention to ohmic contact. In addition, the processing steps can be decreased, that is, (like reference numerals show like parts in both FIGS. 3 and 13), in FIG. 13, source electrodes 15, 15' are directly disposed on an insulating film 32 which overlies gate electrodes 16, 16', and a semiconductor layer 130 covers all the surface, and further, dot-like electrodes 14, 14" are disposed in such a manner that these 14 and 14" are electrically independent. Such disposition advantageously results in narrowing the channel length between source electrode 15 and dot-like electrode 14 to a great extent.

Figure 14:
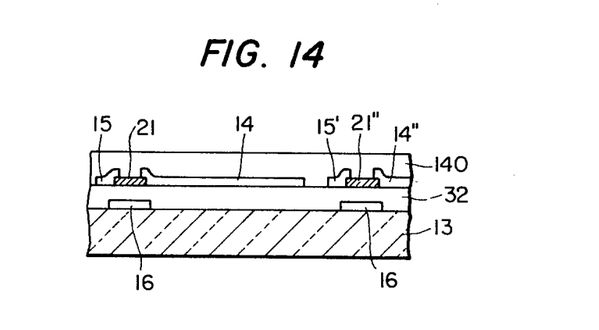
FIG. 14 is a cross-sectional view of a still further substrate.

In FIG. 14, a protecting layer 140 is mounted on the electrode surfaces and semiconductor layers. The protecting layer serves to prevent impurities from entering the semiconductor portions and protect the mechanically weak electrodes. The protecting layer may be composed of an organic or inorganic dielectric material. As an organic one, various high polymer coating may be used, while, as an inorganic one, the same material as that of insulating layer 32 or metal oxides may be used.

A particularly interesting application of the present invention is display and recording of color images as well as display and recording of gradation images. A simple method therefor is that several color toners are prepared and each image signal input corresponding to each color is developed with said color toner.

If various toners are prepared each of which can attach only when its own particular voltage or electric charge is applied to a dot-like electrode and these toners are colored differently from one another, it is possible to develop color images by only one step. In this way, color display can be achieved, and if necessary, color copy can be produced.

In view of the foregoing, when a transistor array connected to a plurality of electrodes is controlled and voltage or electric charge is applied to said electrodes and toners can be selectively attached to said electrodes according to the present invention,    (i) an image display method and a device therefor can be obtained,    (ii) an image recording method and a device therefor can be obtained, or    (iii) a display and recording method capable of writing and erasing and a device therefor can be obtained.

According to the image forming method and a device therefor of the present invention, electronic control is easy, display and recording can be effected at a low voltage by a low power driving, and the device can be of low weight and small size.

We claim:

1. A method for forming images which comprises:

providing an array of dot-like electrodes, each dot-like electrode electrically connected to a transistor with a gate electrode having an on-state and an off-state and a source electrode;

applying scanning signals by line-at-a-time scanning to said gate electrodes to provide the on-state thereof;

applying image signals to said source electrodes during the on-state of said gate electrodes to generate a voltage or electric charge in the corresponding dot-like electrodes; and developing a toner image on said dot-like electrodes charged by said image signals by electrically attaching a toner to said charged dot-like electrodes in said array.

2. The method of claim 1 in which an image signal of a positive image is applied to said source electrodes.

3. The method of claim 1 in which an image signal of a mirror image is applied to said source electrodes.

4. The method of claim 1 including applying an electric field between the image signal charged dot-like electrodes and a counter electrode to said array.

5. The method of claim 1 in which the transistor is a field-effect transistor.

6. The method of claim 1 in which the voltage is a pulse voltage.

7. The method of claim 1 including the step of transferring said toner image to an image receiving member.

8. The method of claim 7 including transferring said toner image to said image receiving memeber by placing said image receiving member between the toner image and said counter electrode.

9. The method of claim 8 in which the image receiving member is a transparent film.

10. The method of claim 7 wherein an image signal of a mirror image is applied to said source electrodes.

11. The method of claim 10 including transferring said toner image to said image receiving member by placing said image receiving member between the toner image and said counter electrode.

12. The method of claim 11 in which the image receiving member is opaque.

13. The method of claim 11 in which the image receiving number is a transparent film.

14. A method for forming images which comprises:
providing an array of dot-like electrodes, each dot-like electrode electrically connected to a transistor with a gate electrode having an on-state and an off-state and a source electrode;
applying scanning signals by line-at-a-time scanning to said gate electrodes to provide the on-state thereof;
applying image signals to said source electrodes during the on-state of said gate electrodes to generate a voltage or electric charge in the corresponding dot-like electrodes;
supplying toner to said array to develop a toner image on said dot-like electrodes to which image signals have been applied and to develop a mirror toner image on the dot-like electrodes to which image signals have not been applied; and
transferring said mirror toner image to an image receiving member.

15. The method of claim 14 including the step of neutralizing the potential on said charged dot-like electrodes or converting said potential to the opposite polarity.

16. The method of claim 15 including wiping away said toner image after said neutralizing step.

17. The method of claim 15 including blowing off said toner image after said neutralizing step.

18. An image forming device which comprises:
an array of dot-like electrode, each dot-like electrode electrically connected to a transistor having a gate electrode having an off-state and an on-state and a source electrode;
means for applying scanning signals by line-at-a-time scanning to said gate electrodes to provide the on-state thereof;
means for applying image signals to said source electrodes during the on-state of said gate electrodes to charge the corresponding dot-like electrodes;
capacity forming means for holding the image signals applied to said source electrodes; and
means for supplying toner to said array to form a toner image on said charged dot-like electrodes.

19. The device of claim 18, wherein said capacity forming means comprises (a) a group of dot-like electrodes and (b) counter electrodes arranged at predetermined intervals therefrom.

20. The device of claim 18 including means for transferring said toner image to an image receiving member.

21. The device of claim 20 including a counter electrode.

22. The device of claim 18 in which the array is arranged on a transparent substrate.

23. The device of claim 18 is which the transistor is a field-effect transistor.

24. The device of claim 18 in which the transistor has a semiconductor selected from the group consisting of amorphous silicon semiconductor, CdS semiconductor, Cd.Se semiconductor, Te semiconductor and metal oxide semiconductor.

25. The device of claim 18 in which the transistor has a silicon-on-sapphire semiconductor circuit.

26. The device of claim 19 or 21 in which the distance between the dot-like electrodes and counter electrode ranges fro 50 $\mu$m to 500 $\mu$m.

27. The device of claim 18, wherein said capacity forming means comprises capacitor counter electrodes formed on a substrate and dot-like electrodes provided through an intermediary layer.

28. The device of claim 18 in which a resistor having a resistance R is provided, R satisfying the relation:

$$R\ on << R << R\ off$$

where R on is the on-resistance of the transistor and R off is the off-resistance of the transistor.

29. The device of claim 18 in which the array of dot-like electrodes has a protecting layer thereon.

30. The device of claim 29 in which the protecting layer is composed of a material selected from the group consisting or organic polymers and inorganic materials.

31. The device of claim 18 in which the array of dot-like electrodes is composed of a transparent conductive material.

32. The device of claim 18 in which the array of dot-like electrodes is composed of a reflective metal.

33. The device of claim 18 in which the surface of the array of dot-like electrodes is a scattering surface.

* * * * *

UNITED STATES PATENT AND TRADEMARK OFFICE
CERTIFICATE OF CORRECTION

PATENT NO. : 4,448,867
DATED : May 15, 1984
INVENTOR(S) : OHKUBO, ET AL.

It is certified that error appears in the above-identified patent and that said Letters Patent is hereby corrected as shown below:

Col. 2, line 66, "thereof" should be --therefor--.
Col. 4, line 43, "44" should be --41--.
Col. 7, line 23, "attached portioned" should be --portion--.
Col. 10, lines 54 and 55, "address gates lines or to adjacent gate" should be --address gate lines or to adjacent gates--.

Claim 8, line 2, "memeber" should be --member--.
Claim 13, line 2, "receiving number" should be --receiving member--.

Signed and Sealed this

Twelfth Day of February 1985

[SEAL]

Attest:

DONALD J. QUIGG

Attesting Officer        Acting Commissioner of Patents and Trademarks